United States Patent [19]

Maisch

[11] 4,017,765
[45] Apr. 12, 1977

[54] SHORT CIRCUIT PROTECTED ELECTRONIC CONTROL SYSTEM

[75] Inventor: Wolfgang Maisch, Ville d'Avray, France

[73] Assignee: Robert Bosch G.m.b.H., Stuttgart, Germany

[22] Filed: Jan. 28, 1976

[21] Appl. No.: 653,280

[30] Foreign Application Priority Data

Apr. 15, 1975 Germany .......................... 2516347

[52] U.S. Cl. ................................ 361/88; 361/187
[51] Int. Cl.² ......................................... H02H 3/24
[58] Field of Search ............. 317/31, 33 R, 33 VR, 317/148.5 R, DIG. 4, DIG. 6; 123/179 L

[56] References Cited

UNITED STATES PATENTS

| | | | |
|---|---|---|---|
| 3,543,091 | 11/1970 | Marek | 317/33 R X |
| 3,678,904 | 7/1972 | Scholl et al. | 317/148.5 R X |
| 3,924,158 | 12/1975 | Farnsworth | 317/31 |

Primary Examiner—Harry E. Moose, Jr.
Attorney, Agent, or Firm—Flynn & Frishauf

[57] ABSTRACT

To protect power transistors and similar electronic electronic control elements which have their main current paths serially connected to loads, one terminal of which is grounded, against short circuits within the loads and without substantial power loss in series sensing resistors, a resistor is connected in shunt with the main current path of the power electronic component, for example the emitter-collector path of a power resistor and a diode connected between this shunt-connected resistor, effectively at the junction of the load and the power semiconductor to the base of a driver transistor which controls the power semiconductor to apply the operating voltage at the junction to the base of the driver transistor so that the power transistor is controlled thereby to blocked condition if the voltage at the junction should drop from operating voltage, the diode, under normal operating condition, being blocked.

16 Claims, 2 Drawing Figures

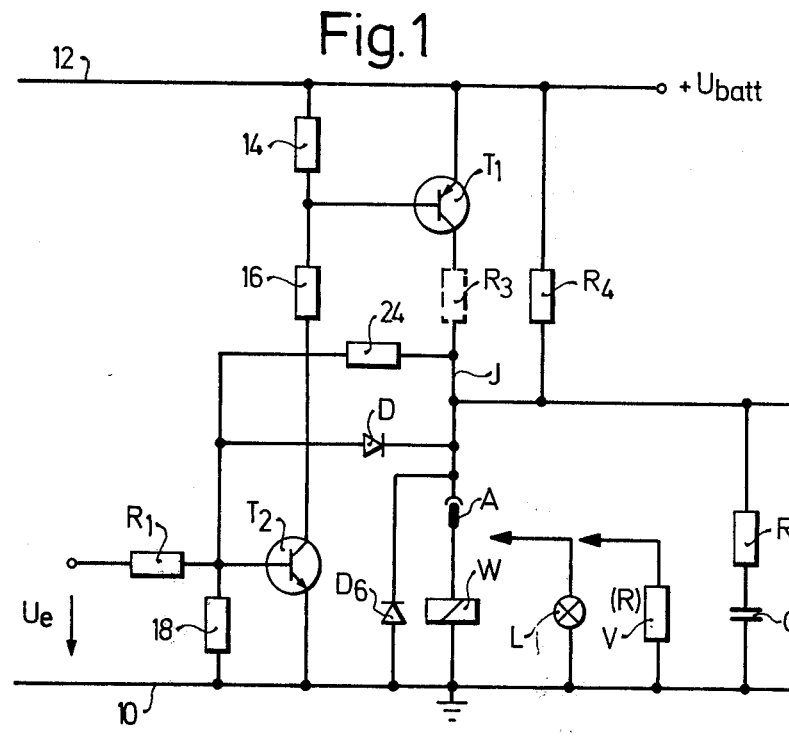
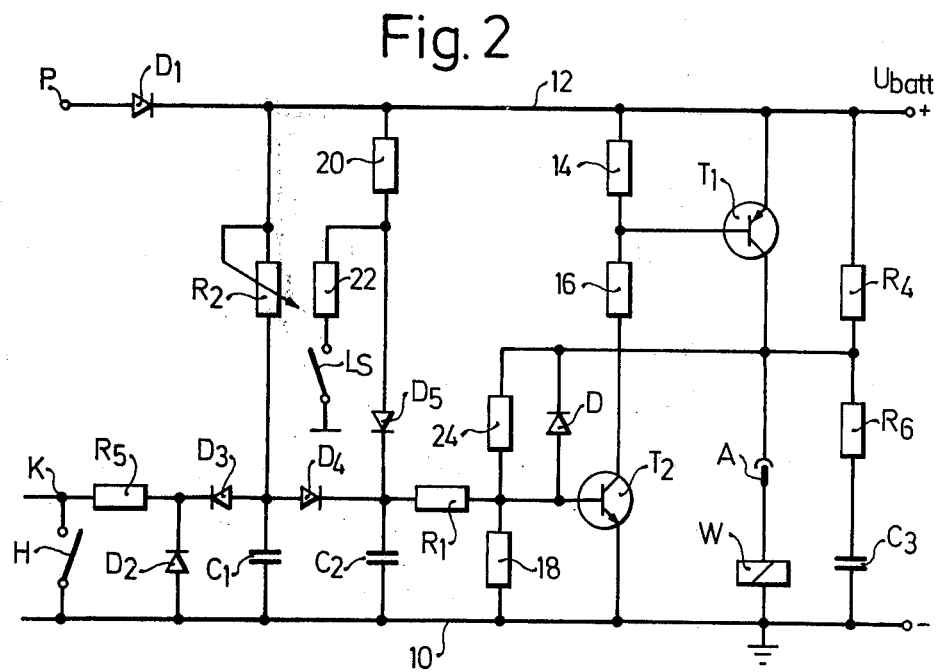

SHORT CIRCUIT PROTECTED ELECTRONIC CONTROL SYSTEM

The present invention relates to an electronic control system to control current flow through a load which is protected against short circuits arising in the load which might cause current flow through the components of the electronic control system at an excessive level, and more particularly to electronic control systems in combination with loads, such as fuel injections valves, servo elements, and similar electrical-mechanical transducers used on automotive vehicles, in which the transducers have one terminal connected to ground or chassis of the vehicle.

Various types of control systems using semiconductor switches are used in applications involving control of current flow to a load; in many such applications, one terminal of the load is connected to ground or chassis or frame of the equipment, the other or "hot" terminal being connected to the main current-carrying path of a semiconductor switching element, for example to the emitter-collector path of a power transistor which is connected to the main "high" power supply bus with its other terminal. Conduction of the electronic switch is controlled in accordance with operation of a control system by a driver transistor, typically of opposite conductivity type to that of the power semiconductor element.

The present invention will be described in connection with a fuel injection system for automotive use; German Disclosure Document DT-OS 2,006,281 discloses a fuel injection system in which electromagnetically operated injection valves have one terminal of the solenoid winding thereof connected to ground, while the other terminal is connected to the emitter of an npn power transistor. The collector of the power transistor is connected to the positive supply bus over a protective resistor. A pnp driver transistor controls the power transistor. The emitter of the pnp driver transistor is directly connected to the positive bus, and the collector to the cathode of a diode connected to ground as well as with a resistor which connects to the base of the power transistor. The emitter-base path of the power transistor is additionally bridged by a resistor. This resistor can be replaced by the emitter-base junction of an auxiliary transistor. If a short circuit to ground should arise at one of the injection valves, the power transistor is protected against damage since current flow through the power transistor will drop across the protective resistor. The voltage actually applied to the power transistor thus is reduced and current flow is limited to a still safe level. In ordinary operation, however, that is, when the injection valves are functioning properly, the current through the emitter-collector path of the power transistor and hence through the solenoid windings of the injection valves causes a voltage drop across the protective resistor, which substantially decreases the operating voltage available to operate the injection valves.

It is an object of the present invention to provide a control system using power semiconductor switching elements, typically power transistors, and which is protected against short circuits arising in the load while being so constructed that full operating voltage is available for application to the load when operating under normal conditions; and, more specifically, to provide a short circuit protected electronic control system for automotive installations in which fuel injection valves, servo transducers, or other loads are selectively energized by essentially full battery voltage when the electronic switch is closed.

SUBJECT MATTER OF THE PRESENT INVENTION

Briefly, the emitter-collector path of a power semiconductor, typically a power transistor, has one terminal connected to operating voltage, for example directly to the positive terminal of a battery, and the other terminal to a junction with the "hot" terminal of the load, for example a fuel injection valve. A resistor is connected across the emitter-collector path of the power transistor, that is, from the positive terminal of the battery to the junction. A driver transistor of opposite conductivity is provided connected to control conduction of the power semiconductor. A diode is connected between the base of the driver transistor and the junction, the diode being poled to block the operating voltage of the junction from the base of the driver transistor. The driver transistor, then, will control the power transistor to blocked condition if a short circuit should arise, that is, if the voltage at the junction should approach ground or chassis potential due to a short circuit in the load; under normal operating conditions, however, the diode will be in blocked state.

In accordance with usual convention, automotive vehicles have an on-board network which is "ground negative", that is, the negative terminal of the electrical system is connected to the chassis of the vehicle. With such an installation, the power semiconductor is preferably a pnp power transistor, having its emitter directly connected to the positive bus of the vehicle, carrying positive battery voltage. The diode then has its cathode connected to the collector of the pnp power transistor and its anode to the base of an npn driver transistor. The base-emitter path of the driver transistor, preferably, has a base resistor connected in parallel thereto. Control voltage is applied to the base of the driver transistor over a coupling resistor having a resistance value which is substantially greater than the d-c resistance of the load connected to the collector of the power transistor, the load in this sense being taken as the reflected resistance value of all the loads which are connected when the power transistor is conductive. These loads may be ohmic loads, servo elements, fuel injection valves, or the like.

The invention will be described by way of example with reference to the accompanying drawings, wherein:

FIG. 1 is a highly schematic block circuit diagram illustrating an embodiment of the circuit of the system of the present invention; and FIG. 2 illustrates another embodiment.

The loads being controlled by the system of the present invention are shown schematically as solenoid winding W of a fuel injection valve; an incandescent lamp L; and, generally, any type of load or current-carrying load element V. The equivalent resistance of any one or all loads connected to be controlled by the respective power transistor $T_1$ can be considered as the resistance R, as schematically indicated in connection with load V in FIG. 1. The equivalent resistance R of the load, or loads may be low, and the current requirements, therefore, rather high. The load, or loads have one terminal connected to the chassis of a motor vehicle (not shown), or to ground, or frame of other apparatus. The chassis, ground or frame forms a common negative bus 10 connected to a battery or other current source (not shown).

The emitter-collector path of a pnp power transistor $T_1$ is connected in series with loads W, L, V which, for simplicity hereinafter, will merely be referred to as "the load". The emitter of transistor $T_1$ is directly connected to the positive power bus 12 of a battery having $+U_{batt}$ applied thereto, for example of a nominal value of 12 volts. The emitter base path of the power transistor $T_1$ is bridged by the emitter resistor 14. The base of the power transistor $T_1$ is connected to the collector resistor 16 of an npn driver transistor $T_2$. The emitter of transistor $T_2$ is connected to chassis bus 10. The base-emitter path of the driver transistor $T_2$ is bridged by a high-resistance base resistor 18. Control voltage $U_e$ is applied to the base of the driver transistor $T_2$ over a coupling resistor $R_1$.

In accordance with the present invention, the junction J of the collector of the driver transistor $T_1$ and the "hot" terminal of the load is connected by means of a diode D to the base of the driver transistor $T_2$, poled such that the anode is connected to the base of the driver transistor $T_2$. A resistor $R_4$ shunts the main current-carrying path of the power transistor $T_1$ and is connected between positive bus 12 and junction J. The resistance value of resistor $R_4$ can be relatively high — for a battery voltage $U_{batt}$ of nominally 12 volts, a resistance of about 1 kilo ohm is suitable.

Operation: Let it be assumed that the control voltage $U_e$ applied to coupling resistor $R_1$ is zero. Driver transistor $T_2$ is blocked; similarly, power transistor $T_1$ will be blocked. The junction J is connected over a connector A to the load and a short circuit occurring between the junction J, for example at the connector A or within anyone of the loads to ground 10 will be without effect on the system since the transistors $T_1$ and $T_2$ are blocked.

Let it be assumed, next, that the control voltage $U_e$ has a positive value of sufficient magnitude to cause driver transistor $T_2$ to become conductive. Collector resistor 16 will thus apply operating voltage to the base of power transistor $T_1$ and power transistor $T_1$ will become conductive. If, in this state of operation, a short circuit arises between connector A and negative bus 10, the diode D which previously was blocked, will become conductive and cause blocking of the driver transistor $T_2$. In effect, the control voltage applied to driver transistor $T_2$ will then be short-circuited through the diode D, thus causing driver transistor $T_2$ to block and, likewise, causing the power transistor $T_1$ to block.

When the driver transistor $T_2$ is ON, that is, has an input voltage $U_e$ representative of a "1" signal applied, then the base-emitter voltage thereof will be in the range of between 0.5 to 0.7 V. The forward voltage drop across the diode D will be below 0.5 V if the diode current is sufficiently small. The diode current can be set by suitable dimensioning of the coupling resistor $R_1$. This relationship is valid also for silicon diodes. Since the d-c resistance R of the load V is, ordinarily, rather small with respect to the resistance of the coupling resistor $R_1$, the power transistor $T_1$ would be continuously blocked since it would be hardly possible to cause the driver transistor $T_2$ to become conductive if reasonably available positive values of a control voltage $U_e$ are applied to the driver transistor $T_2$. The cathode of the diode D thus must be biased by a voltage derived from a voltage divider formed by the parallel resistor $R_4$ and the reflected resistance R of the load. This bias voltage must be at least as great, and preferably somewhat greater than the threshold voltage $U_{be}$ of the driver transistor $T_2$. The current flowing through the resistor $R_4$ is very small so that only a minimum of power is dissipated therein, assuming, for example, the suitable value of about 1,000 ohms.

The system has the outstanding advantage of being failsafe and providing reliable protection to the power transistor $T_1$ while requiring only two inexpensive and highly reliable additional elements. The previously used series resistor $R_3$, indicated in broken lines, is not required for the present invention and has been shown only to contrast with the prior art. Since the power transistor $T_1$ is directly connected between the positive bus 12 of the battery and the load, full battery voltage is applied to the load when the power transistor is conductive (neglecting transistor voltage drop, which is very small). It is thus readily possible to connect loads with uniform nominal 12 V voltage ratings to the control system and have these loads operate at full efficiency, while still providing short circuit protection for the semiconductor switching element.

Embodiment, in accordance with FIG. 2: The load W, in this embodiment, is a solenoid winding to control the nozzle opening in the carburetor of an internal combustion engine for automotive use. The valve associated with the nozzle should be closed when the vehicle is pushed, that is, when the engine operates at a speed which is above the idle speed, with closed throttle, by being driven due to force applied to the vehicle, for example by inertia or by an external pushing force. If, however, the speed of the engine would drop below a limit value which is just above the idle speed, some fuel must be supplied e.g. by supplying fuel through an idle jet, so that the engine does not stop. Fuel supplied to the engine under external, for example pushing force condition, should be inhibited from reaching the engine only if the concurrent criteria are present:

a. the accelerator or fuel supply controller of the internal combustion engine is released, so that the throttle is closed; and b. the speed of the engine is above a certain limit value, corresponding to idling speed.

The condition ($a$) can be satisfied by providing an idle switch which is coupled with the throttle and mechanically operated, or by replacing the customary idle jet adjustment screw used in ordinary commercial carburetors by a screw having an insulated contact tip and a connecting line in communication therewith. The condition ($b$) can be monitored by sensing the ignition pulses of the internal combustion engine in order to determine speed and applying the pulses to an electronic revolution counting circuit, such as a tachometer generator circuit, in which pulse rates are analyzed.

The circuit of FIG. 2 is so arranged that the transistors $T_1$ and $T_2$ not only control the solenoid winding W associated with an electromagnetic idling jet nozzle or valve, but additionally sense output of a resistance-capacitor-diode network which is connected to the ignition breaker contact K so that it can operate as a speed sensing switch. The speed sensing switch, effectively, provides fuel upon dropping speed of the internal combustion engine; as the speed rises, fuel supply is interrupted by the idle jet if the condition of closed throttle is sensed and the speed is above a limiting value. Thus, fuel supply is inhibited if, for example, the vehicle is rolling downhill under engine braking condition, and speed of the vehicle rises above the speed corresponding to idling speed of the engine in the respective gear coupling the wheels of the vehicle to the engine. If the incline down which the vehicle rolls changes to a flat place, so that the speed drops, or if the operator depresses the accelerator, fuel is automatically supplied and the engine will start.

The network provided to measure speed is an adjustable load resistor $R_2$ connected to a capacitor $C_1$. Resistor $R_2$ is connected behind a reverse-polarity protective diode $D_1$, the anode of which is connected to positive terminal T of the battery of the vehicle (not shown). The "hot" terminal of the ignition breaker K can be closed to ground or chassis 10 when the movable contact H closes. The positive or "hot" terminal K of the ignition breaker is further connected over coupling resistor $R_5$ to the cathode of diode $D_2$, the anode of which is connected to chassis bus 10. The resistor $R_5$ is further connected to the cathode of a diode $D_3$, the anode of which is connected to the junction of the capacitor $C_1$ and the resistor $R_2$. This junction is further connected to the anode of a diode $D_4$, the cathode of which is connected to the coupling resistor $R_1$ forming the input terminal to the base of the driver transistor $T_2$, and providing the switching voltage $U_e$ therefor. The diode $D_4$ is additionally connected to a capacitor $C_2$, the other terminal of which is grounded to chassis bus 10 and to the cathode of a diode $D_5$, the anode of which is connected to the junction of two resistors 20, 22. Resistor 20 has its other terminal connected to positive bus 12, while the other terminal of resistor 22 is connected to idle switch LS which, when the throttle control is in idle position, is closed. Idle switch LS opens, to the condition shown in FIG. 2, as soon as the accelerator control of the internal combustion engine is operated, that is, as soon as fuel is intended to be supplied to the engine under operator control.

Operation: Let it be assumed first that the idle switch LS is open, that is, is in the condition of FIG. 2. The second capacitor $C_2$ will thus be charged to approximately battery voltage $U_{batt}$ through resistor 20 and diode $D_5$. Transistors $T_1$ and $T_2$ will be held to be in conductive state, since positive voltage is supplied to the base of transistor $T_2$, the circuit operating as described in connection with FIG. 1. The winding W of the idle jet valve is held in open position.

Let it be assumed, next, that the accelerator pedal is released, so that the engine changes to idle condition. Switch LS will then close. Diode $D_5$ will block and the second capacitor $C_2$ can slowly discharge over resistors $R_1$ and 18, as well as over the base-emitter junction of the driver transistor $T_2$. As soon as the voltage on capacitor $C_2$ passes a minimum value, practically determined by the inherent voltage drop across the junction of driver transistor $T_2$, driver transistor $T_2$ will block, causing the power transistor $T_1$ likewise to block and thus to interrupt energization of solenoid winding W connected to the idling jet. No fuel will be supplied. The time constant for the discharge of the capacitor $C_2$ is selected to be about 2 seconds. This avoids shutting of the idle valve if manual gear-change is carried out with pressure on the accelerator pedal released; under normal operating conditions, gear changing and release of the gas pedal is faster than the discharge time. This discharge time, therefore, prevents closing of the idle jet upon slow gear changing. The idle jet will close only if the idle switch LS is closed for longer than the time constant, in the example for longer than 2 seconds. Upon subsequent operation of the accelerator pedal, and hence opening of the idle switch LS, the second capacitor $C_2$ is rapidly charged over resistor 20 and diode $D_5$, so that the electromagnetic idle jet valve is immediately opened by energization of its winding W. The rapid charge prevents annoying bucking or jolting of the vehicle which might occur if fuel supply to the engine is delayed.

The engine is prevented from stopping when the control pedal or accelerator is released, causing closing of idle switch LS, and hence interruption of fuel supply, by providing a low-resistance charging circuit for the second capacitor $C_2$ when a certain minimum speed of the engine is passed. This low-resistance charge is effected by the resistor $R_2$. The first capacitor $C_1$ is discharged upon each ignition cycle over resistor $R_5$ and diode $D_3$ as well as over the breaker contact K of the breaker switch H during the time when the breaker switch H is closed, placing terminal K at ground or chassis voltage. During the subsequent open period of the breaker switch H, the voltage at the "hot" breaker contact K rises to a positive value. This voltage may be an average value which is greater, or equal, to battery voltage $U_{batt}$. During the open-time of the breaker K, H, diode $D_3$ blocks, so that capacitor $C_1$ can charge. During this charge period, the voltage of capacitor $C_1$ will become higher as the engine operates slower, since the open-period of the switch will be longer. If the voltage at the first capacitor $C_1$ is greater than that on the second capacitor $C_2$, then both capacitors $C_1$ and $C_2$ are rapidly charged over resistor $R_2$, with peak rectification by diode $D_4$ and the second capacitor $C_2$. The diode $D_2$ suppresses high negative voltage peaks which might arise across the breaker terminal K if the breaker is serially connected with the primary winding of an ignition coil — as is customary in many battery ignition systems. The diode $D_1$ prevents destruction of the power transistor $T_1$ if the control system is connected to the starter battery with reverse polarity.

Resistor 22 prevents noise or extraneous voltages from being coupled into the network by the idle switch LS, with which resistor 22 is connected in series.

FIG. 1 shows a free-wheeling diode $D_6$ connected in parallel with the solenoid winding load W. A similar free-wheeling diode can be used in parallel to the load W in FIG. 2. This diode must, however, be dimensioned for the full excitation current of the winding W. The free-wheeling diode can be replaced by a circuit including resistor $R_6$ and capacitor $C_3$, series-connected to the junction J, or used in addition thereto, as shown in FIG. 1. Capacitor $C_3$ is connected to negative bus 10. The R/C circuit prevents application of a negative voltage pulse to the junction J upon sudden collapse of the supply voltage between the negative bus 10 and the positive bus 12; this collapse might cause a current pulse through the diode $D_6$, which might cause undesired switch-over of the two transistors $T_1$, $T_2$ which might operate in the form of a multivibrator oscillator. The danger of such spurious response is increased if, in accordance with the embodiment of FIG. 2, a resistor 24 is provided connected in parallel to the diode D which affects positive feedback between the two transistors. Omitting the free-wheeling diode $D_6$ (FIG. 2) has the advantage that the polarity protective diode $D_1$ may also be omitted. The power transistor $T_1$ is protected upon inadvertent grounding of the connection A by the combination of the resistor $R_4$ and the diode D, as previously explained in connection with the operation of the circuit in accordance with FIG. 1.

The diode $D_2$ (FIG. 2) can be omitted when the control circuit is used in connection with an electronic ignition system, since in electronic ignition systems negative voltages will not arise at the breaker contact K, H.

Various changes and modifications may be made within the inventive concept.

I claim:

1. Short circuit protected electronic control system to protect a power transistor ($T_1$) against short circuit in a load (W, L, V) connected in series with the emitter-collector path of the power transistor, in which the series circuit formed by the emitter-collector path of the power transistor ($T_1$) and the load (W, L, V) is essentially directly connected across a power source (10, 12; P, $U_{batt}$) to permit application of essentially full source voltage to the load upon conduction of the transistor, said system having a driver transistor ($T_2$), the emitter-collector path of which is connected to the base of the power transistor ($T_1$) to control conduction thereof, said system further comprising a resistor ($R_4$) connected in shunt with the emitter-collector path of the power transistor ($T_1$) and having one terminal thereof connected to the junction (J) of the emitter-collector path of the power transistor ($T_1$) and the load (W, L, V);

and a diode (D) connected between said junction (J) and the base of the driver transistor and poled to block the voltage of the junction (J) from the base of the driver transistor ($T_2$), the voltage at said junction, under normal operating conditions, being determined by the relative internal resistance of the power transistor ($T_1$) and the resistance of the load and being blocked by said diode so that, under normal conditions, the operation of the circuit is unaffected by the presence of the diode (D) while, under short circuit conditions of the load (W, L, V), the diode becomes conductive and effectively short-circuits the base of the driver transistor ($T_2$) to cause the driver transistor to block and control the power transistor, likewise, to block and thus prevent damage to the power transistor ($T_1$) upon short circuit arising in the load.

2. System according to claim 1, wherein the driver transistor ($T_2$) is of opposite conductivity-type (npn) to the conductivity of the power transistor ($T_1$; pnp), and said transistors are connected in a circuit in which the power transistor ($T_1$) and the driver transistor ($T_2$) are jointly in blocked, or conductive state, respectively, as determined by the base-emitter voltage at the driver transistor ($T_2$).

3. System according to claim 2, wherein the source (10, 12) comprises an active terminal (12) and a chassis, or ground terminal (10), the load (W, L, V) is connected to the source at the chassis or ground terminal (10) and the base-emitter voltage applied to the driver transistor ($T_2$) which causes the driver transistor to become conductive is a voltage greater than its inherent base-emitter voltage, the diode (D), upon short circuit of the load to chassis or ground terminal (10), applying a voltage to the base of the driver transistor ($T_2$) which is at or below the base-emitter voltage of the driver transistor ($T_2$).

4. System according to claim 3, wherein the source (10, 12) comprises the terminals of an automotive battery, and the load comprises the control winding of a fuel injection valve.

5. System according to claim 3, wherein the source comprises the terminals of an automotive battery and the load comprises an automotive electrical appliance including at least one inductive load.

6. System according to claim 3, wherein the source comprises the terminals of an automotive battery, the power transistor ($T_1$) has its emitter directly connected to the positive terminal (12) of the battery, and the diode (D) has its cathode connected to the collector of the power transistor ($T_1$).

7. System according to claim 3, wherein the source comprises an automotive battery, and the load comprises at least one inductive load, and a capacitor-resistor ($C_3$, $R_6$) series circuit is connected in parallel to the load (W) and between said junction (J) and the chassis or ground terminal (10).

8. System according to claim 1, further comprising a coupling resistor (24) connected in parallel to the diode (D) to increase feedback of the circuit.

9. System according to claim 3, wherein the source comprises an automotive battery and the load comprises a solenoid (W) controlling operation of an internal combustion engine having an ignition breaker switch (H) having a "hot" terminal (K) at a voltage above that of the chassis or ground terminal (10); and a speed sensing network including at least one capacitor ($C_1$, $C_2$), at least one resistor ($R_1$, $R_2$, $R_5$) and at least one diode ($D_1$ to $D_5$) connecting the "hot" terminal (K) of the breaker system to the base of the driver transistor ($T_2$).

10. System according to claim 9, wherein said speed sensing network comprises two capacitors ($C_1$, $C_2$) having one electrode, each, connected to the chassis or ground terminal (10);

the emitter of the driver transistor ($T_2$) is connected to the chassis or ground terminal (10);

a diode ($D_4$) connected between the other electrodes of the capacitors ($C_1$, $C_2$), a first coupling resistor ($R_5$) and a diode ($D_3$) being connected between the "hot" terminal (K) of the ignition breaker and the first capacitor ($C_1$), and a resistor ($R_2$) connecting said other terminal of said first capacitor ($C_1$) to the active terminal (12) of the battery.

11. System according to claim 10, wherein said resistor ($R_2$) connected to the active terminal (12) of the battery is adjustable.

12. System according to claim 10, further comprising an idle switch (LS) connected to the throttle of the engine and closed, when the engine is under idling conditions, said idle switch (LS) having one terminal connected to the chassis or ground terminal (10) of the battery and its other terminal connected to two serially connected resistors (20, 22) which, in turn, are connected to the active terminal (12) of the battery;

and a coupling diode ($D_5$) connecting the junction of said serially connected resistors (20, 22) to the second capacitor ($C_2$).

13. System according to claim 3, further comprising a logic network (K, H; $C_1$, $C_2$; $D_2$, $D_3$, $D_4$, $R_2$, $R_5$; LS, $D_5$) connected to the base of the driver transistor ($T_2$) to apply to the base of the driver transistor either a voltage substantially in excess of the base-emitter voltage, representative of an ON signal causing said driver transistor ($T_2$) and hence said power transistor ($T_1$) to become conductive, or a voltage less than said base-emitter voltage representative of an OFF signal causing said driver transistor and hence said power transistor to block, the voltage being applied to said base being controlled by logical conjunction of voltage within said logic network.

14. System according to claim 13, wherein said logic network includes an idle sensing switch, sensing idle position of an internal combustion engine controller and a speed sensing network sensing operating speed of the internal combustion engine, said logical conjunction causing an OFF signal comprising: speed of the engine above a predetermined limit and controller in idle position.

15. System according to claim 1, wherein said resistor ($R_4$) connected in shunt with the emitter-collector path of the power transistor ($T_1$) has a value which is high with respect to the conductive internal resistance of said power transistor.

16. System according to claim 15, wherein the resistance value of said resistor ($R_4$) is in the order of about 1 kilo ohm to clamp the diode (D) to a value higher than the base-emitter voltage of the driver transistor ($T_2$) under normal operating conditions of the system and provide a bias voltage to the cathode of the diode (D) which is greater or at least as great as the base-emitter threshold voltage of the driver transistor ($T_2$).

* * * * *